United States Patent
Tandon et al.

(10) Patent No.: US 8,008,215 B2
(45) Date of Patent: Aug. 30, 2011

(54) INTEGRATION OF BURIED OXIDE LAYERS WITH CRYSTALLINE LAYERS

(75) Inventors: Sheila Tandon, Niskayuna, NY (US); Gale Petrich, Arlington, MA (US); Leslie Kolodziejski, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 593 days.

(21) Appl. No.: 11/433,736

(22) Filed: May 12, 2006

(65) Prior Publication Data
US 2006/0276002 A1   Dec. 7, 2006

Related U.S. Application Data

(60) Provisional application No. 60/680,319, filed on May 12, 2005.

(51) Int. Cl.
*H01L 21/31* (2006.01)
(52) U.S. Cl. ........ 438/770; 438/442; 438/606; 438/660; 438/761; 438/765
(58) Field of Classification Search .................. 438/439, 438/442, 452, 606, 660, 761, 763, 770, FOR. 134
See application file for complete search history.

(56) References Cited

U.S. PATENT DOCUMENTS

| | | | | |
|---|---|---|---|---|
| 4,031,404 A | * | 6/1977 | Martz et al. | 290/40 R |
| 6,148,016 A | * | 11/2000 | Hegblom et al. | 372/50.21 |
| 6,159,866 A | * | 12/2000 | Gronet et al. | 438/769 |
| 6,239,044 B1 | * | 5/2001 | Kashiwagi et al. | 438/787 |

(Continued)

FOREIGN PATENT DOCUMENTS
DE   10234694   2/2004

OTHER PUBLICATIONS

Tandon et al., "Broadband saturable Bragg reflectors from the infrared to visible using oxidized A1As" Lasers and Electro-Optics, 2004 (CLEO) Conference on San Francisco, CA USA, May 20-21, 2004, Piscataway, NJ, USA, IEEE, vol. 2, May 20, 2004, pp. 482-484, XP010744824.

(Continued)

*Primary Examiner* — N Drew Richards
*Assistant Examiner* — Joannie A Garcia
(74) *Attorney, Agent, or Firm* — Gesmer Updegrove LLP

(57) ABSTRACT

A method of forming a buried oxide/crystalline III-V semiconductor dielectric stack is presented. The method includes providing a substrate and forming a layered structure on the substrate comprising of layers of different materials, one of the different materials is selected to be an oxidizable material to form one or more buried low index oxide layers. A first sequence of oxidizing steps are performed on the layered structure by exposing the edges of the layered structure to a succession of temperature increases in the presence of steam from an initial temperature to the desired oxidation temperature for a time interval equal to the sum of the time intervals of the succession of temperature increases. Also, the method includes performing a second sequential oxidizing step with steam on the layered structure at the specific oxidation temperature for a specific time interval. Furthermore, the method includes performing a final sequence of oxidizing steps on the structure by ramping down from the desired oxidation temperature to a final temperature when the oxidizing material is completely oxidized to form the one or more buried low index oxide layers.

36 Claims, 9 Drawing Sheets

Step 1: Growth of III-V heterostructure

Step 2: Photolithography/wet etching to define mesa

U.S. PATENT DOCUMENTS

| | | | |
|---|---|---|---|
| 6,335,295 B1* | 1/2002 | Patel | 438/773 |
| 6,358,867 B1* | 3/2002 | Tews et al. | 438/771 |
| 6,458,714 B1* | 10/2002 | Powell et al. | 438/770 |
| 6,541,394 B1* | 4/2003 | Chen et al. | 438/770 |
| 6,570,905 B1* | 5/2003 | Ebeling | 372/96 |
| 6,774,012 B1* | 8/2004 | Narayanan | 438/471 |
| 2002/0176474 A1* | 11/2002 | Huang et al. | 372/96 |
| 2006/0039653 A1* | 2/2006 | Painter et al. | 385/50 |
| 2006/0062266 A1* | 3/2006 | Jewell | 372/43.01 |

OTHER PUBLICATIONS

Erchak et al., "Large scale oxidation of alas layers for broadband saturable bragg reflectors" Conference on Lasers and Electro-Optics. (CLEO 2002). Technical Digest. Post Conference Edition. Long Beach, CA May 19-24, 2002, Trends in Optics and Photonics. Washington, WA: OSA, US, vol. 73, May 19, 2002, pp. 225-225, XP010606648.

Kim et al., "Lateral wet oxidation of AlxGa1-xAs-GaAs depending on its structures" Applied Physics Letters, AIP, American Institute of Physics, Melville, NY, US vol. 69, No. 22, Nov. 25, 1996, pp. 3357-3359, XP012016684.

Choquette et al., "Advances in selective wet oxidation of AlGaAs Alloys" IEEE Journal of Selected Topics in Quantum Electronics, IEEE Service Center, Piscataway, NJ, US, vol. 3, No. 3, Jun. 1997, pp. 916-926, XP011062261.

Tsang, "Self-terminating thermal oxidation of AlAs epilayers grown on GaAs by molecular beam epitaxy" Applied Physics Letters, Sep. 1978, 33(5) pp. 426-429.

Kim et al., "Lateral wet oxidation if AlxGa1-xAs-GaAs depending on its structures" Applied Physics Letters, Nov. 1996, 69(22), pp. 3357-3359.

Ogur et al., "Evaluation of buried oxide formation in low-dose SIMOX process" Applied Surface Science 2000, pp. 104-110.

Evans et al., "AxGa1-xAs native-oxide-based distributed Bragg reflectors for vertica cavity surface emitting lasers" Journal of Applied Physics, vol. 84, No. 10, Nov. 15, 1998, pp. 5436-5440.

Koley et al., "Dependence of lateral oxidation rate on thickness of AlAs layer of interest as a current aperture in vertical-cavity surface-emitting laser structures" Journal of Applied Physics, vol. 84, No. 1 Jul. 1998, pp. 600-605.

Dallesasse et al., "Hydrolyzation oxidation of AlxGa1-xAs-AlAs-GaAs quantum well heterostructures and superlattices" Applied Physics Letters, 57(26), Dec. 1990, pp. 2844-2846.

Langenfelder et al., "Lateral oxidation of buried AxGa1-xAs layers in a wet ambient" Journal of Applied Physics 82 (7) Oct. 1997, pp. 3548-3551.

Choquette et al., "Selective oxidation of buried AlGaAs versus AlAs layers" Applied Physics Letters 69 (10) Sep. 1996, pp. 1385-1387.

Jia et al., "The study of thermal stability during wet oxidation of AlAs" Journal of Crystal Growth 223 (2001) pp. 484-488.

* cited by examiner

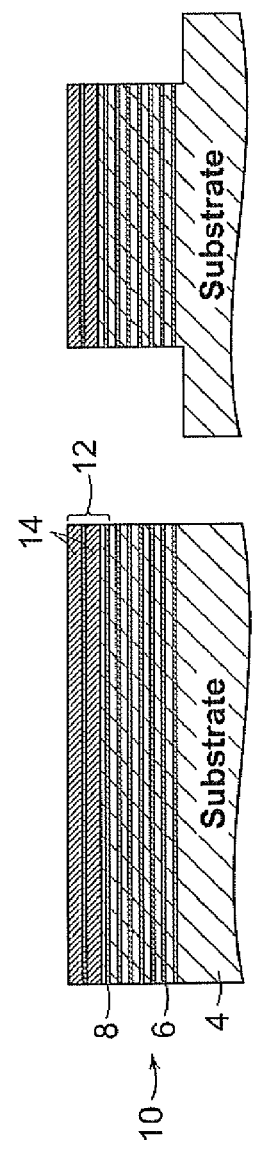
FIG. 1A  Step 1: Growth of III-V heterostructure
FIG. 1B  Step 2: Photolithography/wet etching to define mesa
FIG. 1C  Step 3: Wet thermal oxidation

INTEGRATION OF BURIED OXIDE LAYERS WITH CRYSTALLINE LAYERS

PRIORITY INFORMATION

This application claims priority from provisional application Ser. No. 60/680,319 filed May 12, 2005, which is incorporated herein by reference in its entirety.

This invention was made with government support awarded by the Office of Naval Research under Contract No. N00014-02-1-0717. The government has certain rights in the invention.

BACKGROUND OF THE INVENTION

The invention relates to the field of forming and maintaining the structural integrity of crystalline/buried oxide dielectric stacks.

Dielectric stacks composed of semiconductor crystalline layers and their oxide are found in a variety of devices such as Vertical Cavity Surface Emitting Lasers (VCSELs), saturable Bragg reflectors (SBRs), and photonic crystals. Although both VCSELs and SBRs employ alternating layers of high and low indices of refraction, the purpose of the oxide in the structures are typically different. In VCSELs, the selective oxidation of AlAs to form $Al_xO_y$ is used to create current apertures as well as to increase the optical mode's lateral confinement. In SBRs, the selective oxidation of AlAs is used to increase the index contrast in the dielectric mirror stack. By increasing the index contrast, fewer pairs of high index material and $Al_xO_y$ are required to achieve the desired reflectivity while at the same time increasing the high reflectivity bandwidth of the dielectric mirror stack.

During the formation of the $Al_xO_y$ from either AlAs or high aluminum content AlGaAs, the final structure, whether it is a SBR, VCSEL or even a photonic crystal structure, can experience delamination at the buried oxide/crystalline material interface. The crystalline material, which is almost always the high index material, can consist of arsenide, phosphide, antimonide, or dilute nitride-based III-V material. The exact thickness of the oxide layers and the crystalline layers depend on the application. In the case of SBRs, the thickness of the oxide layers and the crystalline III-V material in the dielectric mirror stack is $\lambda/4n$ where n is the index of refraction of the respective material and $\lambda$ is the wavelength of operation. In addition, the extent of the oxidation is on the order of several 100's of nanometers. In the case of VCSELs, the thickness of the oxide layer that is used as a current aperture is significantly less than $\lambda/4n$ and the oxidation extent is typically a few 10's of nanometers. In the case of photonic crystals, the thickness of the single buried oxide layers is on the order of $\lambda/n$ in order to optically isolate the high index material that is used in the photonic crystal from the high index substrate material.

SUMMARY OF THE INVENTION

According to one aspect of the invention, there is provided a method of forming a stable buried oxide/crystalline III-V semiconductor dielectric stack. The method includes providing a substrate and forming a layered structure on the substrate comprising of layers of different materials, one of the different materials is selected to be an oxidizable material to form one or more buried low index oxide layers. A first sequence of oxidizing steps are performed on the layered structure by exposing the edges of the layered structure to a succession of temperature increases in the presence of steam from an initial temperature to the desired oxidation temperature for a time interval equal to the sum of the time intervals of the succession of temperature increases. Also, the method includes performing a second sequential oxidizing step with steam on the layered structure at the specific oxidation temperature for a specific time interval. Furthermore, the method includes performing a final sequence of oxidizing steps on the structure by ramping down from the desired oxidation temperature to a final temperature when the oxidizing material is completely oxidized to form the one or more buried low index oxide layers.

According to another aspect of the invention, there is provided a method of forming an optical reflector. The method includes providing a substrate and forming a layered structure on the substrate comprising of layers of different materials, one of the different materials is selected to be an oxidizable material to form one or more buried low index oxide layers. A first sequence of oxidizing steps are performed on the layered structure by exposing the edges of the layered structure to a succession of temperature increases in the presence of steam from an initial temperature to the desired oxidation temperature for a time interval equal to the sum of the time intervals of the succession of temperature increases. Also, the method includes performing a second sequential oxidizing step with steam on the layered structure at the specific oxidation temperature for a specific time interval. Furthermore, the method includes performing a final sequence of oxidizing steps on the structure by ramping down from the desired oxidation temperature to a final temperature when the oxidizing material is completely oxidized to form the one or more buried low index oxide layers.

According to another aspect of the invention, there is provided a method of forming an insulating electrical current aperture. The method includes providing a substrate and forming a layered structure on the substrate comprising of layers of different materials, one of the different materials is selected to be an oxidizable material to form one or more buried insulating oxide layers. A first sequence of oxidizing steps are performed on the layered structure by exposing the edges of the layered structure to a succession of temperature increases in the presence of steam from an initial temperature to the desired oxidation temperature for a time interval equal to the sum of the time intervals of the succession of temperature increases. Also, the method includes performing a second sequential oxidizing step with steam on the layered structure at the specific oxidation temperature for a specific time interval. Furthermore, the method includes performing a final sequence of oxidizing steps on the structure by ramping down from the desired oxidation temperature to a final temperature when the oxidizing material is oxidized to form the one or more buried insulating oxide layers.

According to another aspect of the invention, there is provided a saturated Bragg reflector (SBR). The SBR includes a substrate. A layered structure is formed on the substrate comprising of layers of different materials. One of the different materials is selected to be an oxidizable material to form one or more buried low index oxide layers. The edges of the layered structure is exposed to a succession of temperature increases in the presence of steam from an initial temperature to the desired oxidation temperature for a time interval equal to the sum of the time intervals of the succession of temperature increases. Afterwards, the layered structure is oxidized at the desired oxidation temperature for a specific time interval. The temperature of the layered structure is decreased from the desired oxidation temperature to a final or idle temperature when the oxidizing material is completely oxidized to form the buried low index oxide layers.

BRIEF DESCRIPTION OF THE DRAWINGS

FIGS. 1A-1C are schematic diagrams illustrating an overview of the saturable Bragg reflector fabrication sequence;

DETAILED DESCRIPTION OF THE INVENTION

Figure 2A:
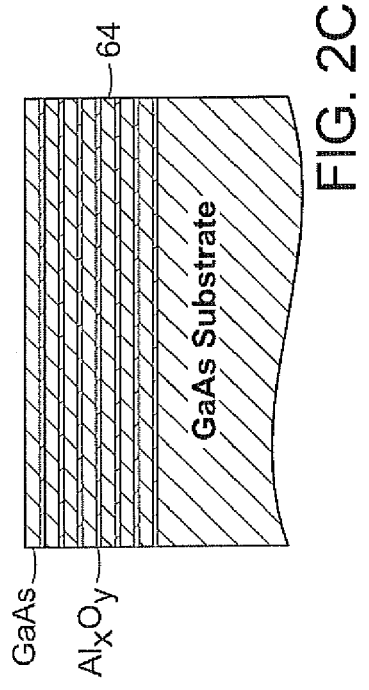
FIGS. 2A-2C are schematic diagrams illustrating the lateral oxidation of AlAs layers to form a buried oxide/crystalline III-V semiconductor layered structure.

The invention relates to the design and fabrication of buried oxide/crystalline III-V semiconductor layered structures in which the crystalline III-V semiconductor layers comprise of a subset of the following elements: Al, Ga, In, N, P, As, Sb, C, Si, and Be. For those skilled in the art, one of the most challenging structures to fabricate are broadband Saturable Bragg Reflectors (SBRs) that are used to self-start and modelock a number of laser systems including the Cr:Forsterite, Cr:YAG, Ti:Sapphire, and $Er:Bi_2O_3$ fiber lasers. In SBRs, multiple buried oxide layers with the largest possible spatial or lateral extent are required. In contrast, electrically-pumped vertical cavity surface emitting lasers, typically have one or two buried oxide layers that are utilized to form electrical current apertures that have a lateral extent that is smaller and, sometimes, significantly smaller than SBRs. To fabricate SBR structures such that the SBR will not limit the pulse width of the pulse emitted by the laser, the bandwidth of the SBR dielectric mirror stack must be as broad as possible which, in turn, means that the index contrast between the layers that comprise the dielectric mirror stack must be maximized. One such method of maximizing the index contract is by employing buried oxides within the dielectric mirror stack.

In FIG. 1A, the initial all-crystalline SBR structure 2 is grown using an epitaxial growth technique such as molecular beam epitaxy or metal organic chemical vapor deposition on a GaAs (100) substrate 4. The first layers grown on the substrate are the dielectric mirror layers 6 which are pairs of unoxidizable III-V material such as GaAs, AlGaAs or phosphide layers such as lattice-matched InGaAlP and oxidizable III-V material such as AlAs or AlGaAs in which the Al content is greater than 80% 8, 10. The absorber 12 and cladding layers 14 that complete the SBR are then grown on top of the mirror layers 6.

In FIG. 1B, SBR mesas 16 are defined using standard photolithography techniques and wet etchants in order to expose a cross-section of the SBR structure 2 for lateral oxidation as shown in FIG. 1C. A (1:8:40) $H_2SO_4:H_2O_2:H_2O$ etchant is used to etch the mesa pattern into arsenic-based SBRs, while a (1:1:2) $HCl:H_2NO_3:H_2O$ etchant is used to etch SBR mesas that are comprised of both arsenide and phosphide layers.

Figure 2B:
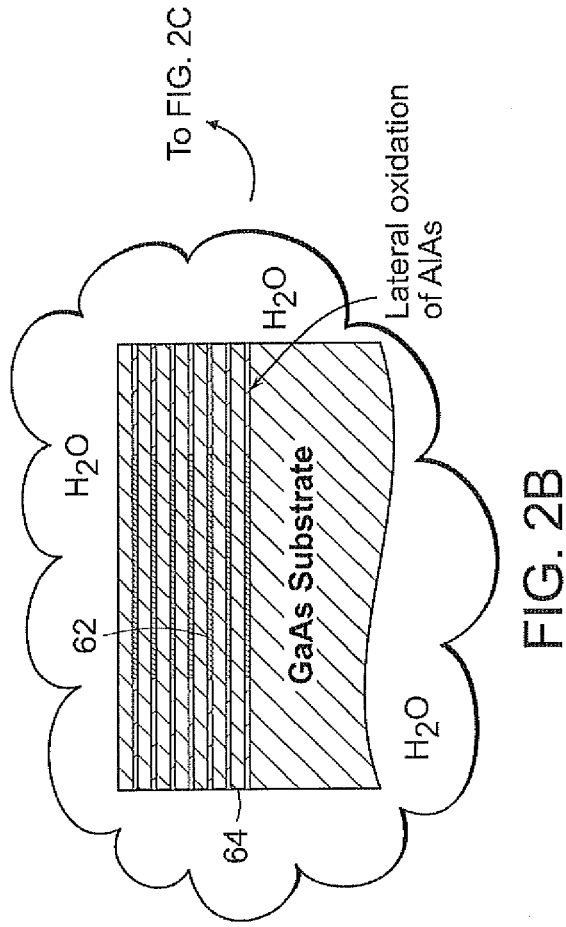
Figure 2C:
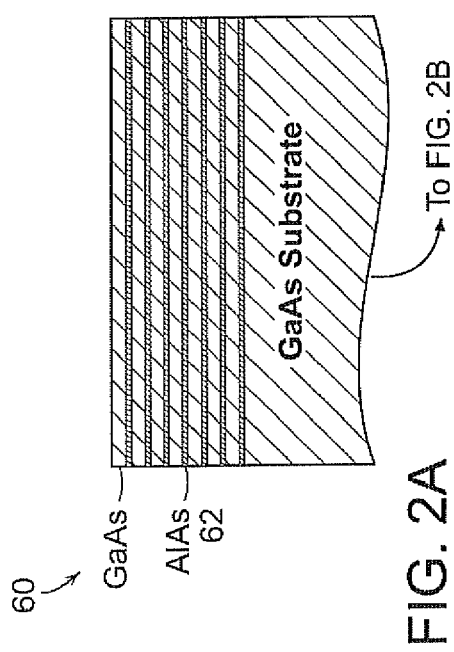

After chemical etching, in FIG. 1C, the exposed AlAs or high Al content AlGaAs layers 62 are converted to $Al_xO_y$ layers 64 through a lateral oxidation process. The oxidation process proceeds as illustrated in FIG. 2. When $Al_xGa_{(1-x)}As$ (x>0.8) is exposed to water vapor at an elevated temperature, $Al_xGa_{(1-x)}As$ (x>0.8) layers 62 begin to oxidize and are converted to $Al_xO_y$. Because the wet chemical etching process, shown in FIG. 1B, exposes the sides of the layered structure 60, the oxidation reaction begins at the edges of the structure 40 where the $Al_xGa_{(1-x)}As$ (x>0.8) layers 64 are exposed and can therefore react with the $H_2O$ vapor. As water vapor diffuses into the structure and reacts with the $Al_xGa_{(1-x)}As$ (x>0.8) layers 64, the oxidation reaction moves laterally from the edges of the structure 60 to the center of the structure, converting the $Al_xGa_{(1-x)}As$ (x>0.8) layers 62 to aluminum oxide layers 64. The oxidation process terminates when all of the $Al_xGa_{(1-x)}As$ (x>0.8) layers 64 have been converted to $Al_xO_y$. AlAs is typically chosen as the oxidizing layer because it experiences the fastest oxidation rates of all of the AlGaAs alloys thus allowing for larger-scale oxidations.

Figure 3:
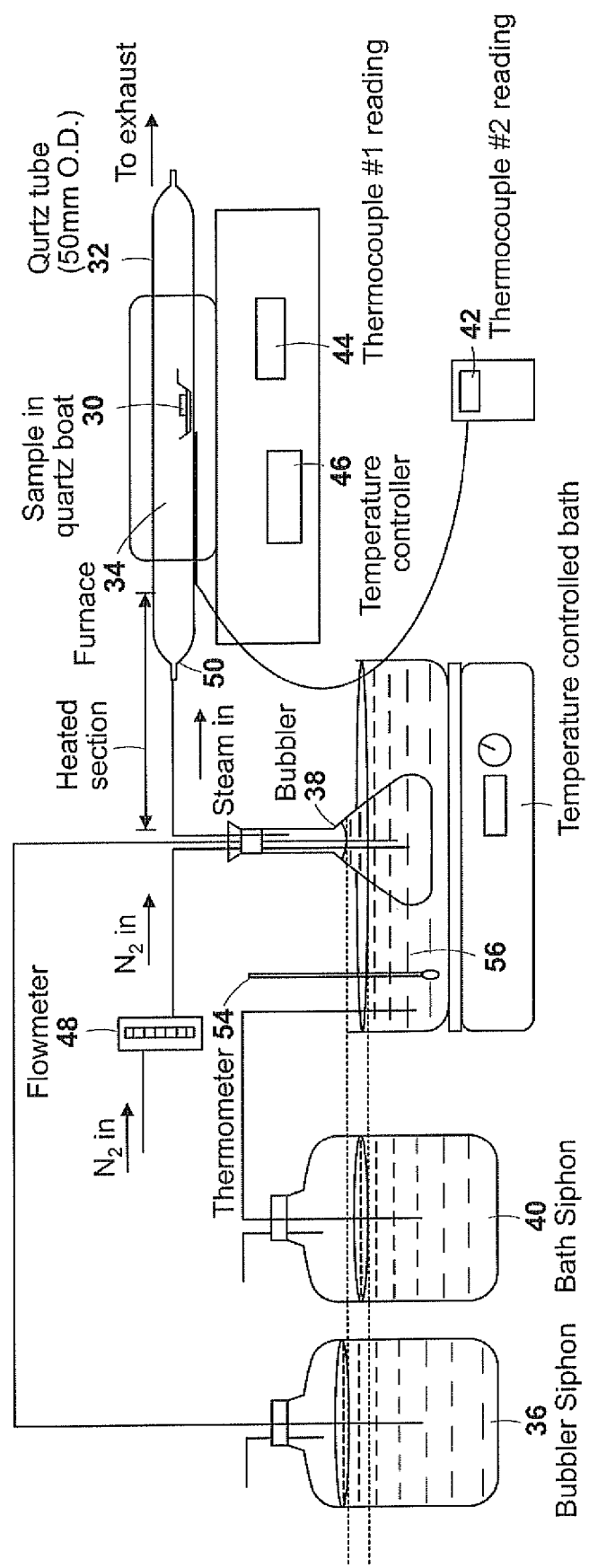
FIG. 3 is a schematic diagram illustrating a possible oxidation setup.

The apparatus used to perform the oxidation process is shown in FIG. 3. The layered structure that is to be oxidized, sits in a quartz boat 30 located within a quartz tube 32 that runs lengthwise through a furnace 34. The boat 30 is used to move the sample into and out of the tube 32. During oxidation, nitrogen gas bubbles through a flask 38 containing 90° C. de-ionized (DI) water so that steam is carried out of the flask 38 and through the quartz furnace tube 32. The flow rate of the nitrogen gas is maintained at 2,205 sccm in order to maintain a steady flow rate of steam over the sample. The DI water in the flask 38 is heated via a water bath 56. Heating tapes are used on the input section 50 and on the output section of the quartz tube 32 to prevent condensation of the steam upon entering and exiting the furnace 34. A temperature controller 46 is used to control the temperature of the furnace 34. Two thermocouples monitor the furnace temperature; the first thermocouple is connected to the temperature controller 46 and to the display unit 44. A second thermocouple is connected to a hand held display unit 42 and is used to verify the first thermocouple temperature measurement.

Because typical oxidations last for multiple hours, siphons slowly feed water into the bubbler flask 36 and into the heating bath 40 in order to maintain water levels sufficient for oxidation. Typical $Al_xGa_{(1-x)}As$ (x>0.8) oxidation temperatures range from 400-435° C. and are measured by the thermocouple 40 inside the furnace 34. The flowmeter 48 controls the amount of nitrogen that enters the flask 38 and a thermometer 54 is used to measure the temperature of the bath 56.

For those skilled in the art, the simple single zone tube furnace and the associated bubbler and siphons can be replaced by the more commonly used, multiple zone, tube furnace with a pyrogenic torch subsystem that is used in the thermal oxidation of silicon in the commercial manufacturing of silicon integrated circuits. The torch subsystem burns high purity $H_2$ with high purity $O_2$ to form steam with the minimum amount of impurities. Since $H_2$ and $O_2$ are used, the bubbler and siphons are not necessary.

A number of dielectric stack structures have been studied with the goal of creating large area, stable buried oxide structures such as SBRs with broadband high-index-contrast mirrors. In the simplest design, a structure with alternating layers of GaAs and AlAs is grown, and 500 µm circular mesas are defined and oxidized in an attempt to form $GaAs/Al_xO_y$ dielectric mirror stacks. Upon oxidation, however, this type of structure can suffer from severe deformation. For example, FIG. 4A shows the deformation of one mesa after an oxidation at 435° C. for 2 hours.

Figure 4A:
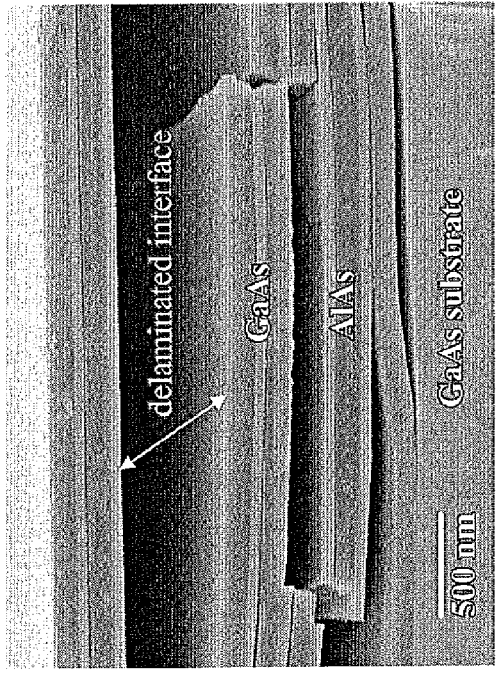
FIG. 4A is a micrograph observing the surface of a GaAs/AlAs dielectric stack that is deformed due to stresses introduced by the lateral oxidation of AlAs at 435° C. for 2 hours.
Figure 4B:
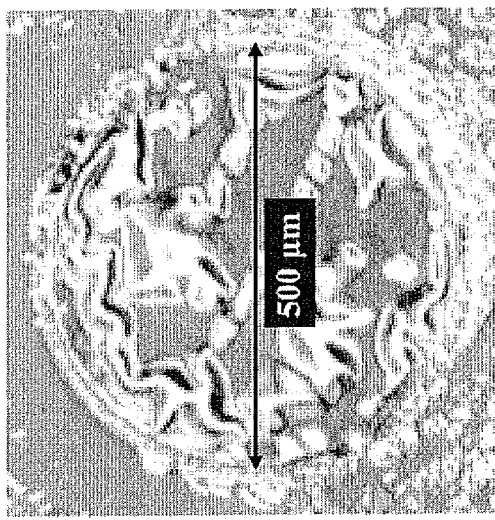
FIG. 4B is a Scanning Electron Micrograph (SEM) showing the cross-section of the stack with delaminated or completely separated layers.

The cross-section, that is shown in FIG. 4B, illustrates that the deformation is due to delamination between the 106 nm thick GaAs layers and the 240 nm thick AlAs layers. This delamination is most likely due to two factors which are working in conjunction with each other: 1) the difference in volume between AlAs and $Al_xO_y$, and 2) the weak bonding between the GaAs and $Al_xO_y$ layers. The volume per Al atom in AlAs is $(3.57 \text{ Å})^3$ while in $\gamma$-$Al_2O_3$ the volume per Al atom is $(2.85 \text{ Å})^3$, corresponding to a 20% linear contraction of the AlAs layers upon oxidation. Experimentally however, the linear contraction is approximately 10-12%. If the bonding at the interface between the oxidized AlAs and the surrounding layers is not strong enough, this amount of volume contraction can contribute to the delamination of the structure.

The delamination illustrated in FIGS. 4A-4B therefore suggests that the bonding strength at the $GaAs/Al_xO_y$ interface is insufficient to withstand the volume contraction of the AlAs layers. The weakness of the interface can be due to gallium-oxygen bonds which form at the oxide boundary and which are much weaker than aluminum-oxygen bonds. With the lateral oxidation of AlAs, it is possible that thin layers of GaAs are oxidized in the vertical direction leading to a weakened $GaAs/Al_xO_y$ interface.

Figure 5A:
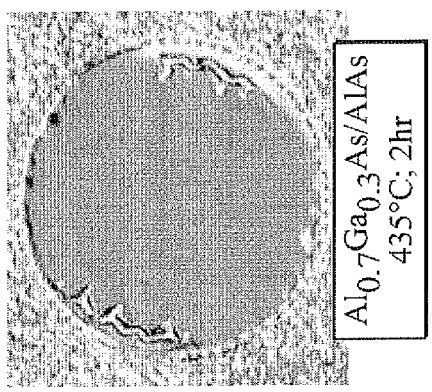
FIG. 5A is a differential interference contrast (DIC) micrograph illustrating a GaAs/AlAs structure oxidized at 375° C. for 10 hours.
Figure 5B:
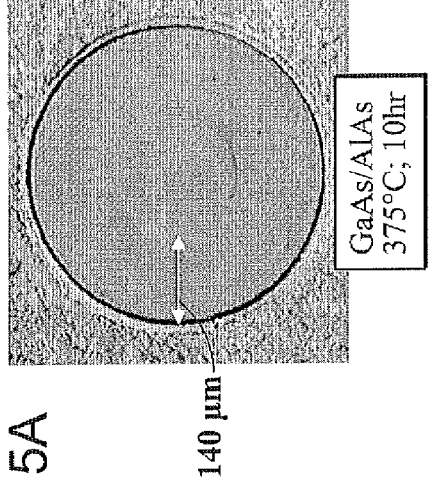
FIG. 5B is a DIC micrograph illustrating an $Al_{0.7}Ga_{0.3}As$/AlAs structure oxidized at 435° C. for 2 hours.

With the same GaAs/AlAs layered structure, oxidizing at lower temperatures lessens the delamination effects but with the trade-off of increased oxidation times. FIG. 5A shows that by lowering the oxidation temperature to 375° C., a 10 hour oxidation only partially oxidized the mesa (140 µm from the edge) but eliminated the delamination effects. At oxidation temperatures above 375° C., faster oxidation rates are achieved but with increasing delamination effects suggesting that the delamination effect is thermally activated.

To use buried oxide/crystalline III-V semiconductor structures to their full potential, one must minimize delamination effects by decreasing the structure contraction during the oxidation of $Al_xGa_{(1-x)}As$ (x>0.8) layers. In many structures, the thicknesses of the $Al_xGa_{(1-x)}As$ (x>0.8) layers and the thicknesses of the crystalline, high index layers are determined by the particular application. Lowering the oxidation temperature has been demonstrated to stabilize the structure during oxidation at the expense of lower oxidation rates and hence longer oxidation times.

Figure 6A:
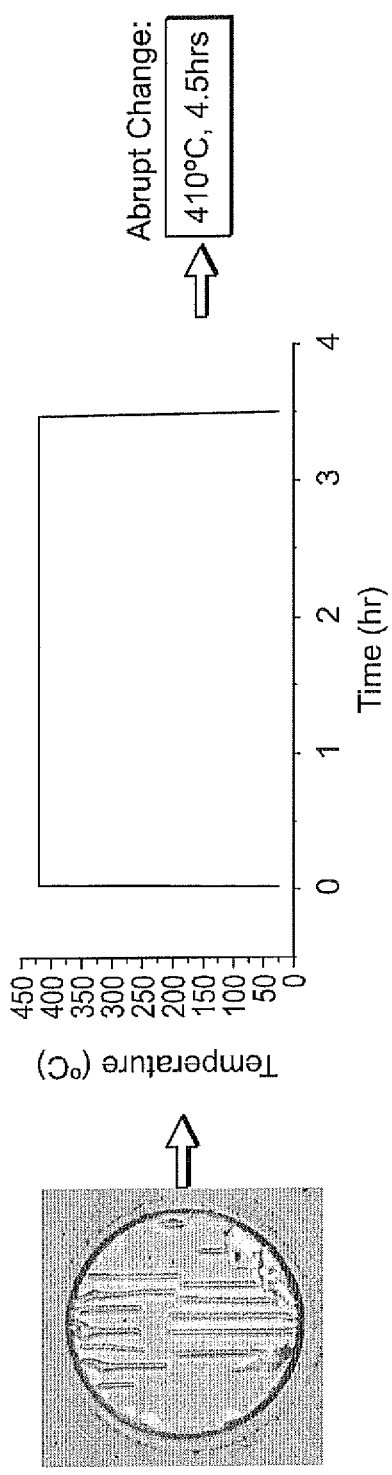
FIG. 6A is the top view observed using DIC microscopy of an AlAs/GaAs layer stack that has been oxidized for 4.5 hours at an oxidation temperature of 410° C.
Figure 6B:
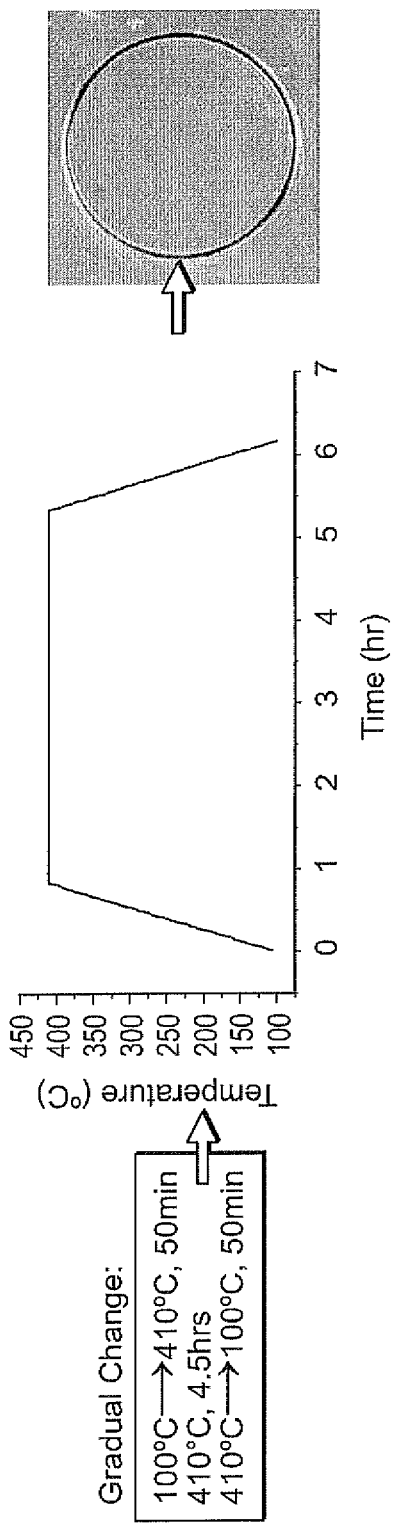
FIG. 6B is the same layer stack only now the temperature versus time profile is not abrupt but includes two temperature ramps over time.

Investigations into the oxidation process indicate that the manner in which the oxidation process is initiated strongly influences the stability of the structure during oxidation. By implementing a temperature ramp in the presence of steam before and after the desired oxidation temperature is reached, many of the delamination effects are eliminated. Oxidation of a SBR structure is performed at 410° C. for 4 hours but with a temperature ramp before and after the 4 hour oxidation soak period. The initial ramp comprised of a linear increase in temperature beginning at 100° C. and ending at 410° C. over 50 minutes; steam is present throughout. In otherwords, the edges of the SBR structure is exposed to a succession of temperature increases in the presence of steam from an initial temperature to a desired oxidation temperature for a time interval equal to the sum of the time intervals of the succession of temperature increases. The linear ramp is programmed into the furnace temperature controller. The same 6.2° C./min ramp is programmed in the opposite direction at the end of the oxidation process. The result of the oxidation process with this time-temperature profile is shown in FIG. 6B. No stripes or evidence of delamination are observed. In contrast, when a sample is inserted directly into and removed from the oxidation furnace that is held at 410° C. with steam, stripes of delamination were observed after the 4.5 hr oxidation process as shown in FIG. 6A.

Figure 7:
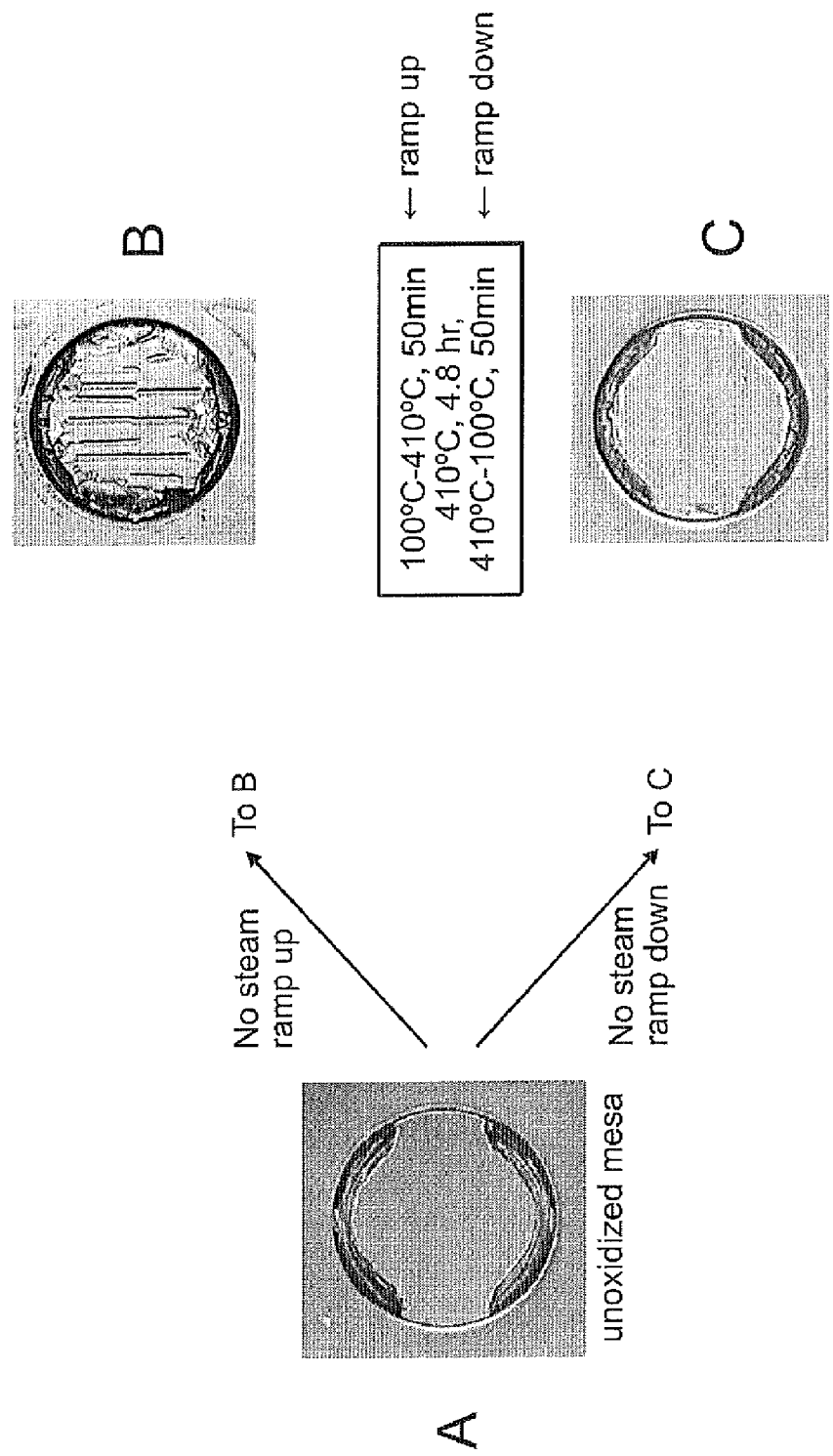
FIG. 7 are DIC micrographs that show oxidation results when steam is introduced during particular stages of the temperature ramps.

Closer investigations revealed that the presence of steam during the ramping process influenced the stability of the buried oxide/crystalline III-V semiconductor structures. As illustrated in FIG. 7, two oxidations are performed on mesas of the same SBR structure from similar areas of the wafer. Both oxidations are performed with the same time-temperature profile: 100° C. to 410° C. over 50 minutes, 410° C. for 4.8 hours, 410° C. to 100° C. over 50 minutes. The first oxidation is implemented with no steam present during the ramp up, but steam present during the 4.8 hour oxidation and during the ramp down. The second oxidation is implemented with steam present during the ramp up and during the 4.8 hour oxidation, but not during the ramp down. FIG. 7 shows that without steam present during the ramp up, severe delamination problems occurred. However, when steam is present during the ramp up, the delamination problems are not observed. These results indicate that steam must be present during the initial temperature ramp up to reduce delamination, but is not critical during the temperature ramp down implying that a pure temperature shock does not initiate delamination in the absorber. Instead, an oxidation shock can initiate delamination. With steam present during the initial temperature ramp up, the oxidation process is slowly initiated with the oxidation rate increasing gradually over the duration of the ramp. With no steam present, the oxidation process abruptly begins with the rate determined by the furnace temperature at which steam is introduced. If this oxidation rate is too fast, delamination occurs.

Figure 8A:
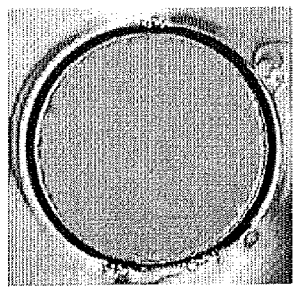
FIG. 8A is a DIC micrograph showing a layer stack that was oxidized at 410° C. for 6 hr with a temperature profile similar to FIG. 6B.
Figure 8B:
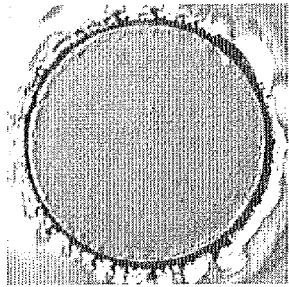
FIG. 8B is a DIC micrograph showing a layer stack that was oxidized at 410° C. for 4.5 hr with a temperature profile similar to FIG. 6B.
Figure 8C:
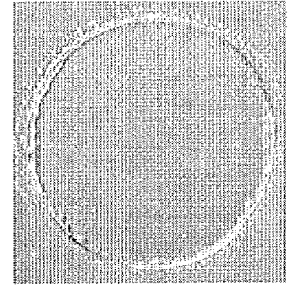
FIG. 8C is a DIC micrograph showing a layer stack that was oxidized at 410° C. for 5 hr with a temperature profile similar to FIG. 6B.

The success of the oxidation ramp at reducing delamination effects is observed for SBR structures with varying absorber thickness, AlAs thickness, and cladding layer composition as shown by the DIC micrographs of SBR mesas that are presented in FIGS. 8A-8C. For all of these structures, delamination effects are observed when oxidations are performed without ramping of the oxidation temperature and, hence, the oxidation rate. In particular, FIG. 8A shows a mesa oxidized at 410° C. over 6 hr with oxidation temperature ramps. FIG. 8B shows a mesa oxidized at 410° C. over 4.5 hr with oxidation temperature ramps, while FIG. 8C shows a mesa oxidized at 410° C. over 5 hr with oxidation temperature ramps. All oxidation temperature ramps are either from 100 to 410° C. for 50 minutes or 410° C. to 100° C. for 50 min in the presence of steam.

Figure 9A:
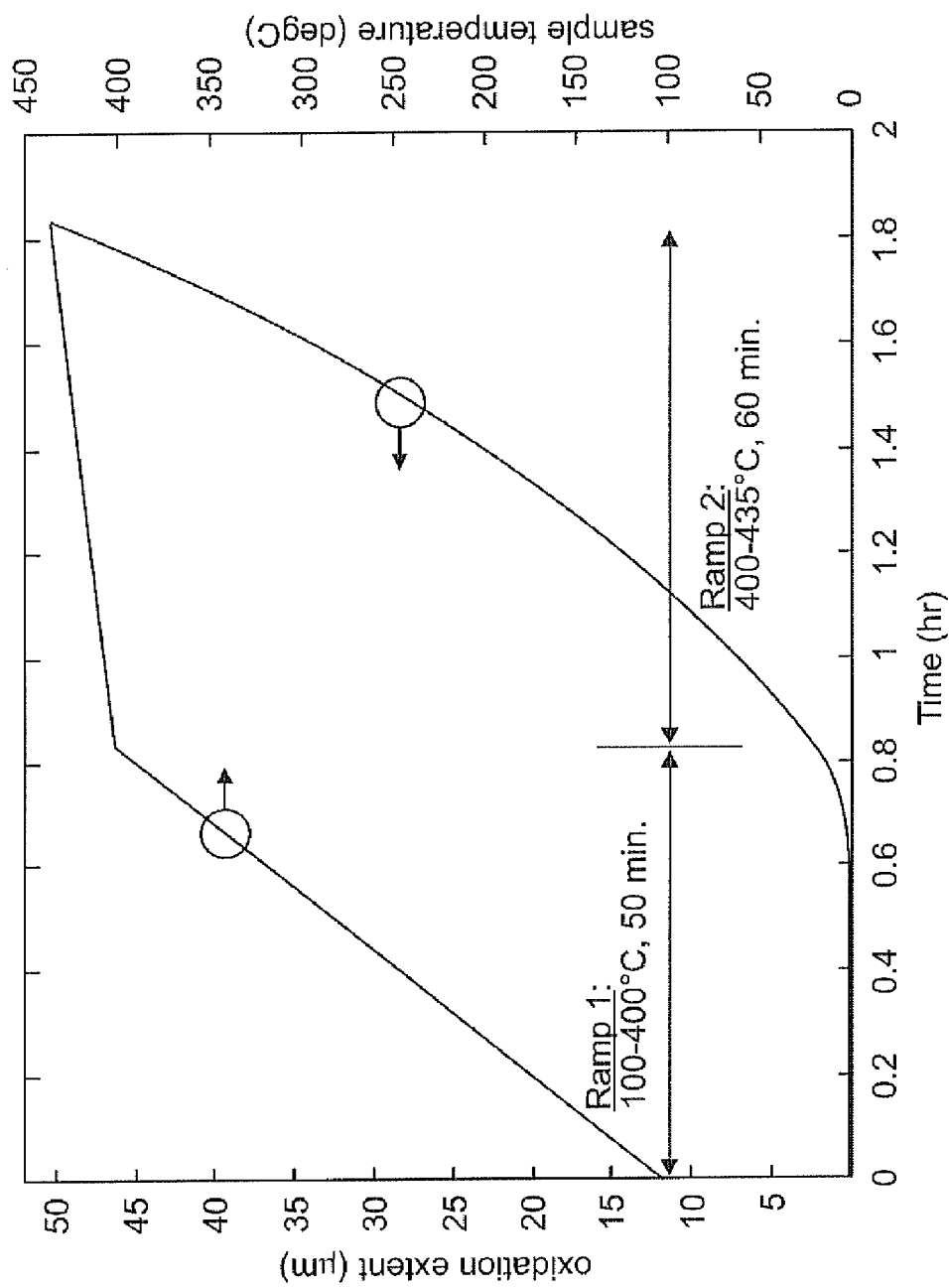
FIG. 9A is a graph illustrating an estimate of the radial extent of the oxidation front for a multi-temperature rate sequence.
Figure 9B:
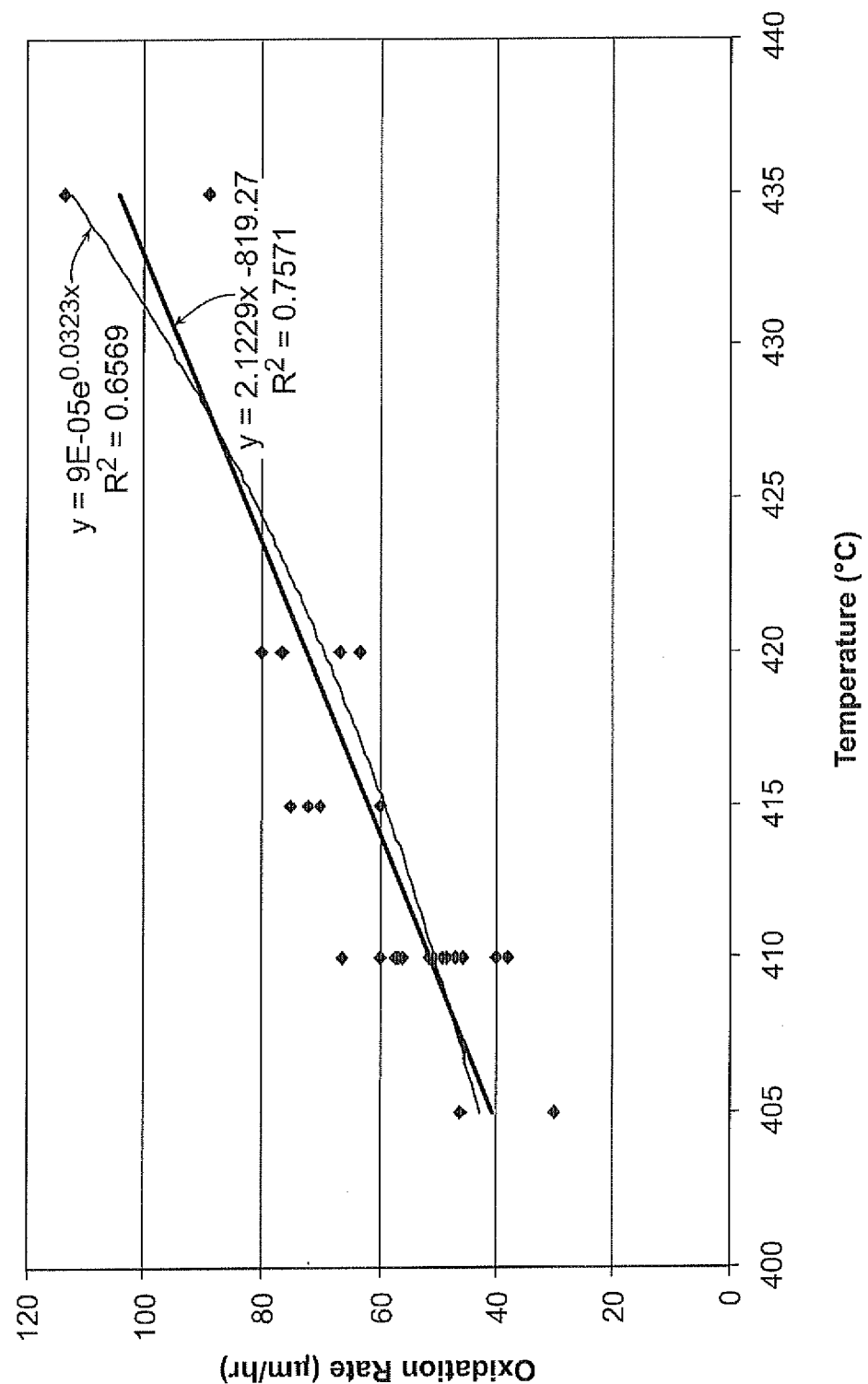
FIG. 9B is a graph illustrating the average oxidation rate versus temperature.

To minimize the overall oxidation time, a sequence of two temperature ramps were used to increase the oxidation temperature to 435° C. from the usual 410° C. oxidation temperature. The first ramp increased the furnace temperature from 100° C. to 400° C. in 50 min while the second ramp increased the furnace temperature from 400° C. to 435° C. in 60 minutes; both in the presence of steam. SBR structures oxidized using this multi-temperature ramp sequence still exhibited some delamination. The fact that the slow oxidation ramp from 400° C. to 435° C. did not eliminate delamination at the higher oxidation temperature provides evidence that the overall delamination effects are temperature dependent—such that by exceeding a critical time/temperature point, delamination can still occur. The calculated oxidation extent is present in FIG. 9A using the oxidation rate versus oxidation temperature data presented in FIG. 9B. The oxidation rates are fitted to both linear and exponential curves. Although the linear curve yields a better fit according to its $R^2$ value, the exponential fit is more physically plausible.

Although the present invention has been shown and described with respect to several preferred embodiments thereof, various changes, omissions and additions to the form and detail thereof, can be made therein, without departing from the spirit and scope of the invention.

What is claimed is:

1. A method of forming a stable dielectric stack comprising:
    providing a substrate,
    forming a layered structure on said substrate comprising of layers of different materials so as to define the stable dielectric stack having large area buried oxide structures, one of said different materials is selected to be an oxidizable material to form one or more buried low index oxide layers;
    performing a first sequence of oxidizing steps on said structure by exposing the edges of the said layered structure to a number of controlled succession of temperature linear increases in the presence of steam from an initial temperature to the desired oxidation temperature for a time interval equal to the sum of the time intervals of said succession of linear temperature increases, the linear succession of temperature increases involves a ramping up from the initial temperature to the desired oxidation temperature;
    performing a second sequential oxidizing step with steam on said layered structure at said specific oxidation temperature for a specific time interval; and
    performing a final sequence of oxidizing steps on said structure by linearly ramping down in the presence of steam from said desired oxidation temperature to a final temperature when said oxidizing material is oxidized to form said one or more buried low index oxide layers so as to avoid delamination within the stable dielectric stack having large area buried oxide structures.

2. The method of claim 1, wherein said substrate comprises of GaAs.

3. The method of claim 1, wherein said alternating structure comprises a high index material composed of a subset of the following elements: Al, Ga, In, N, P, As, Sb, Si, C and Be.

4. The method of claim 1, wherein said oxidizing material comprise of $Al_xGa_{(1-x)}As$ (x>0.8).

5. The method of claim 1, wherein said low index oxide layers comprises of $Al_xO_y$.

6. The method of claim 1, wherein said initial temperature comprises an idle temperature with an extremely slow oxidation rate.

7. The method of claim 1, wherein the said temperature increase is at a rate on the order of 6° C./min.

8. The method of claim 1, wherein said oxidation soak temperature results in the desired oxidation rate.

9. The method of claim 8, wherein the said oxidation soak temperature is approximately 410° C.

10. The method of claim 8 wherein said soak time interval is capable of achieving the desired amount of lateral oxidation.

11. The method of claim 1, wherein said final oxidizing sequence comprises a temperature decrease in the presence of steam.

12. The method of claim 1, wherein said final oxidizing sequence comprises a temperature decrease without the presence of steam.

13. A method of forming an optical reflector comprising:
    providing a substrate,
    forming a layered structure on said substrate comprising of layers of different materials so as to define the stable dielectric stack having large area buried oxide structures, one of said different materials is selected to be an oxidizable material to form one or more buried low index oxide layers;
    performing a first sequence of oxidizing steps on said structure by exposing the edges of the said layered structure to a number of controlled succession of linear temperature increases in the presence of steam from an initial temperature to the desired oxidation temperature for a time interval equal to the sum of the time intervals of said linear succession of temperature increases, the linear succession of temperature increases involves a ramping up from the initial temperature to the desired oxidation temperature;
    performing a second sequential oxidizing step with steam on said layered structure at said specific oxidation temperature for a specific time interval; and
    performing a final sequence of oxidizing steps on said structure by ramping down in the presence of steam from said desired oxidation temperature to a final temperature when said oxidizing material is oxidized to form said one or more buried low index oxide layers so as to avoid delamination within the stable dielectric stack having large area buried oxide structures.

14. The method of claim 13, wherein said substrate comprises of GaAs.

15. The method of claim 13, wherein said alternating structure comprises a high index material composed of a subset of the following elements: Al, Ga, In, N, P, As, Sb, Si, C and Be.

16. The method of claim 13, wherein said oxidizing material comprise of $Al_xGa_{(1-x)}As$ (x>0.8).

17. The method of claim 13, wherein said low index oxide layers comprises of $Al_xO_y$.

18. The method of claim 13, wherein said initial temperature comprises an idle temperature with an extremely slow oxidation rate.

19. The method of claim 13, wherein the said temperature increase is at a rate on the order of 6° C./min.

20. The method of claim 13, wherein said oxidation soak temperature results in the desired oxidation rate.

21. The method of claim 20, wherein the said oxidation soak temperature is approximately 410° C.

22. The method of claim 20, wherein said soak time interval is capable of achieving the desired amount of lateral oxidation.

23. The method of claim 13, wherein said final oxidizing sequence comprises a temperature decrease in the presence of steam.

24. The method of claim 13, wherein said third oxidizing sequence comprises a temperature decrease without the presence of steam.

25. A method of forming an insulating electrical current aperture comprising:
    providing a substrate,
    forming a layered structure on said substrate comprising of layers of different materials so as to define the stable dielectric stack having large area buried oxide structures, one of said different materials is selected to be an oxidizable material to form one or more buried insulating oxide layers;

performing a first sequence of oxidizing steps on said structure by exposing the edges of the said layered structure to a succession of linear temperature increases in the presence of steam from an initial temperature to the desired oxidation temperature for a time interval equal to the sum of the time intervals of said succession of linear temperature increases, the succession of linear temperature increases involves a ramping up from the initial temperature to the desired oxidation temperature;

performing a second sequential oxidizing step with steam on said layered structure at said specific oxidation temperature for a specific time interval; and performing a final sequence of oxidizing steps on said structure by linearly ramping down in the presence of steam from said desired oxidation temperature to a final temperature when said oxidizing material is oxidized to form said one or more buried insulating oxide layers so as to avoid delamination within the stable dielectric stack having large area buried oxide structures.

26. The method of claim 25, wherein said substrate comprises of GaAs.

27. The method of claim 25, wherein said alternating structure comprises a high index material composed of a subset of the following elements: Al, Ga, In, N, P, As, Sb, Si, C and Be.

28. The method of claim 25, wherein said oxidizing material comprise of $Al_xGa_{(1-x)}As$ (x>0.8).

29. The method of claim 25, wherein said insulating oxide layers comprises of $Al_xO_y$.

30. The method of claim 25, wherein said initial temperature comprises an idle temperature with an extremely slow oxidation rate.

31. The method of claim 25, wherein the said temperature increase is at a rate on the order of 6° C./min.

32. The method of claim 25, wherein said oxidation soak temperature results in the desired oxidation rate.

33. The method of claim 32, wherein the said oxidation soak temperature is approximately 410° C.

34. The method of claim 32, wherein said soak time interval is capable of achieving the desired amount of lateral oxidation.

35. The method of claim 25, wherein said third oxidizing sequence comprises a temperature decrease in the presence of steam.

36. The method of claim 25, wherein said final oxidizing sequence comprises a temperature decrease without the presence of steam.

* * * * *